United States Patent
Park

(10) Patent No.: US 6,693,831 B2
(45) Date of Patent: Feb. 17, 2004

(54) APPARATUS OF REPAIRING MEMORY CELL AND METHOD THEREFOR

(75) Inventor: Chul-Sung Park, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 180 days.

(21) Appl. No.: 09/887,974

(22) Filed: Jun. 21, 2001

(65) Prior Publication Data

US 2002/0052070 A1 May 2, 2002

(30) Foreign Application Priority Data

Aug. 3, 2000 (KR) .......................... 2000-45012

(51) Int. Cl.7 ............................................... G11C 7/00
(52) U.S. Cl. ............. 365/200; 365/230.01; 365/230.08; 365/230.06
(58) Field of Search .................. 365/189.01, 230.01, 365/200, 201, 230.06, 230.08

(56) References Cited

U.S. PATENT DOCUMENTS

| | | | |
|---|---|---|---|
| 5,355,344 A | 10/1994 | McClure | |
| 5,526,317 A | 6/1996 | McClure | |
| 5,689,465 A | * 11/1997 | Sukegawa et al. | 365/200 |
| 5,691,945 A | 11/1997 | Liou et al. | |
| 5,471,431 A | 11/1998 | McClure | |
| 5,905,683 A | 5/1999 | McClure | |
| 6,337,829 B1 | 1/2002 | Lee | |
| 6,414,901 B1 | * 7/2002 | Shin | 365/230.08 |
| 6,424,582 B1 | * 7/2002 | Ooishi et al. | 365/200 |
| 6,536,002 B1 | * 3/2003 | Kim | 714/710 |

FOREIGN PATENT DOCUMENTS

KR   1996-047789   10/1996

OTHER PUBLICATIONS

English Translation of Abstract for Korean Application No. 1966-047789.

* cited by examiner

Primary Examiner—Viet Q. Nguyen
(74) Attorney, Agent, or Firm—Marger Johnson & McCollom, P.C.

(57) ABSTRACT

The present invention provides a semiconductor memory cell repairing apparatus and method that can effectively repair memory cells although a various type of failures in memory cells are generated when a rule in the failure is detected.

There is provided a memory cell repairing apparatus includes state fixing parts operable to fix a specific external input address signal out of external input addresses as a constant state, address input receivers operable to receive output signals of the state selecting part and external input signals, address code selecting part operable to receive output address signals of the address input receiver and to convert output address signal path through a control signal which selects address code change to output a changed address signal, and address input buffers operable to receive the changed address signal outputted from the address code selecting part to output a new internal address.

9 Claims, 10 Drawing Sheets

APPARATUS OF REPAIRING MEMORY CELL AND METHOD THEREFOR

This application claims priority from Korean Patent Application No. 2000-45012, filed on Aug. 3, 2000, the entirety of which is hereby incorporated by reference.

BACKGROUND OF THE INVENTION

1. Field of the Invention

The present invention relates to an apparatus and a method of repairing memory cells for converting a higher density memory cell into a lower density memory cell to utilize it, and more particularly to a memory cell repairing apparatus and a method of repairing failed memory cells in case that a rule in failure is detected even though various types of failures are generated.

2. Description of the Prior Art

As integration density in semiconductor memory devices increases, the size of individual cells decreases. In contrast, a cell fabricating process becomes complex in order to obtain the corresponding capacitance irrespective of the smaller size, thus failure rate in cells increases. In case that the amount of failure rate exceeds that of the redundancy, a number of chips cannot be repaired. Accordingly, techniques for repairing normal memory cells other than the failed memory cells are required. For example, first, the technique for repairing memory cells in the range limited to single bit fail, word line fail, and column fail. Second, the technique for repairing memory cells by converting a high integrated circuit to a low integrated circuit.

In the second technique, for example, a 16M-memory device is converted to an 8M memory device, or a 8M memory device is converted to a 4M memory device. The conventional technique such as the second technique is used to repair memory cells selected from the entire memory cells by bonding residual address signals to the ground or power voltage when the failed memory chip is converted to a low integrated device. The second conventional memory cell repairing technique is disclosed in the Korean Patent Application No. 1996-47789 entitled "MEANS FOR REPAIRING PARTIAL BLOCK OF MEMORY CELL AND METHOD OF REPAIRING THE PARTIAL BLOCK USING SAME" filed Oct. 23, 1996 in the name of Samsung Electronics Co., Ltd. (hereinafter, referred to by reference 1), the Korean Patent Application No. 1999-51337 entitled "SEMICONDUCTOR MEMORY APPARATUS AND METHOD OF REPAIRING THE APPARATUS" filed Nov. 18, 1999 in the name of Samsung Electronics Co., Ltd. (hereinafter, referred to by reference 2), and the U.S. Pat. No. 5,905,683 entitled "METHOD AND STRUCTURE FOR RECOVERING SMALLER DENSITY MEMORIES FROM LARGER DENSITY MEMORIES", filed Sep. 29, 1997 in the name ST Microelectronics, INC. (hereinafter referred to by reference 3), respectively. The reference 1 discloses an apparatus and a method of utilizing memory cells as a low integration memory chip by bonding residual address signals to the ground GND or the power voltage VDD in case that any specific partial blocks in the memory cells are frequently failed. The reference 2 discloses an apparatus and a method by which a larger density semiconductor memory device can be converted to a smaller density semiconductor memory device by fixing one address bit to select ½ of 2n partial blocks. The reference 3 discloses a method and structure for recovering smaller density memories from larger density memories, the structure includes a logic determining circuit which comprised of a plurality of fuses and transistors between address pads and address buffers. The logic determining circuit allows signals applied to the address pads through a fusing means to be ignored and forces a logic state on the address buffer.

As described in the above, the references 1 and 3 discloses a memory cell repairing technique for fixing an address state selecting residual address to thereby convert a high density memory to a smaller density memory. However, the conventional memory cell repairing techniques as disclosed in the references 1 and 3 can repair only the memory cell fails which are concentrated on the specific regions of the memory cells as shown in FIG. 8 or FIG. 11, but cannot repair such failure type as that shown in FIGS. 9 and 10.

That is, the conventional memory cell repairing techniques are limited to only the specific memory cell failures as described above, not a variety of memory cell failures, thereby decreasing yield and function of good semiconductor memory devices, particularly decreasing productivity of the semiconductor memory devices.

SUMMARY OF THE INVENTION

The present invention is provided to solve the aforementioned problems and it is an object of the present invention to provide a semiconductor memory cell repairing apparatus and method therefore that can effectively repair memory cells although various types of failures in memory cells are generated.

It is another object of the present invention to provide a memory cell repairing apparatus and a method thereof that can selectively repair normal memory cells out of a variety of types of memory cell failures by converting address scramble map during recovery of smaller density memories from larger density memories due to memory cell failure, thereby increasing yield and productivity of good semiconductor memory devices.

In order to accomplish the aforementioned objects of the present invention, there is provided a memory cell repairing apparatus comprising: state fixing parts operable to fix a specific external input address signal out of external input addresses as a constant state, address input receivers operable to receive output signals of the state selecting part and external input signals, address code selecting part operable to receive output address signals of the address input receiver and to convert output address signal path through a control signal which selects address code change to output a changed address signal, and address input buffers operable to receive the changed address signal outputted from the address code selecting part to output a new internal address.

A method of repairing memory cells by using the memory cell repairing apparatus comprises checking a failure rule through a bit map test of failed memory cells, fixing a residual address signal as a constant state to convert it to a smaller density when a failure rule in the failed memory cells is detected, converting an address scramble map to selectively convert an output-address-signal path by a predetermined control signal in response to the address signal input to thereby change an address code, and converting high density memory cells to smaller density memory cells by outputting the changed address code.

In accordance with the other aspect of the present invention, there is provided a memory cell repairing apparatus being applied to an on-chip cache memory comprising a micro processor for receiving a bit map address signal from the cache memory to detect failure in memory cells and generating a residual address fixing control signal for a smaller density and a control signal for conversion of an address scramble map, an address code selecting part for changing an input-to-output address signal path to convert the residual address fixing control signal for a smaller density by the microprocessor and the address scramble map conversion in response to the control signal to thereby output the converted address buffer signal, and a cache memory being utilized as a smaller density memory cell when a converted address buffer signal is output after an address scramble conversion is performed to a smaller density by the address code selecting part.

BRIEF DESCRIPTION OF THE DRAWINGS

For fuller understanding of the nature and object of the invention, reference should be made to the following detailed description taken in conjunction with the accompanying drawings in which.

DETAILED DESCRIPTION OF THE INVENTION

Figure 1:
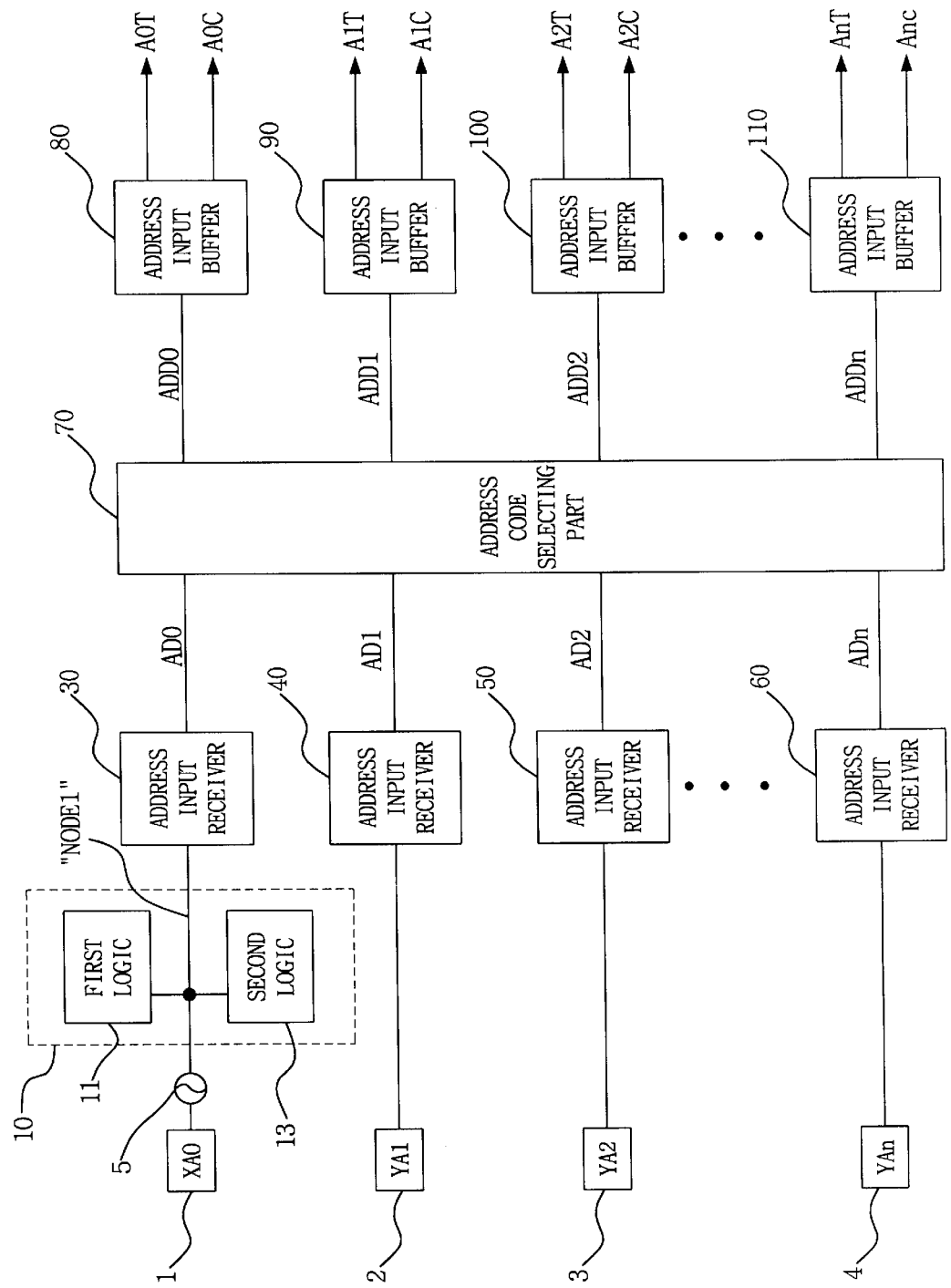
FIG. 1 is a block diagram of a memory cell repairing apparatus in accordance with the present invention.

Objects and aspects of the invention will become apparent from the following detailed description of preferred embodiments with reference to the accompanying drawings. Throughout the drawings, it should be noted that like reference numerals are used for designation of like or equalizers or portion for simplicity of illustration and explanation, detailed description of which will be omitted.

Figure 2:
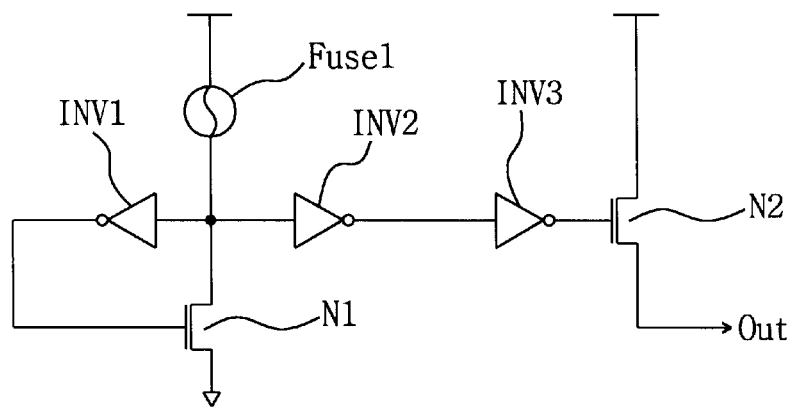
FIG. 2 is a circuit diagram of a first logic 11 of a state fixing part in accordance with an embodiment of the present invention.
Figure 3:
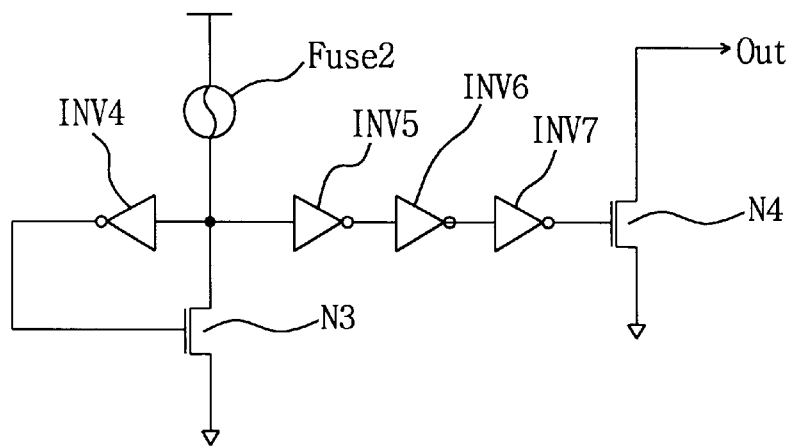
FIG. 3 is a circuit diagram of a first logic 13 of a state fixing part in accordance with an embodiment of the present invention.

FIG. 1 is a block diagram of a memory cell repairing apparatus according to the present invention, which comprises external input address signals 1–4, a state fixing part 10 for fixing residual address signals as a constant state, address input receivers 30, 40, 50, 60, an address code selecting part 70, and address input buffers 80, 90, 100, 110. The XA0 signal 1 of the external input address signals is a residual address signal in the case of conversion into a smaller density memory. For example, the signal corresponds to a residual address signal which is generated when a 16M memory semiconductor is converted to a 8M memory semiconductor. The XA0 signal is input to the address input receiver 30 via a fuse 5 through which electric signals are transferred. The fuse 5 and address input receiver 30 are connected to a node 1. The node 1 is connected to a first logic 11 and a second logic 13 which output fixed signals of logic high and low. When one of the first logic 11 and the second logic 13 is selected as a logic "high" state, the other is fixed as a logic "low" state and output it. Examples of the first logic 11 and the second logic 13 are shown in FIGS. 2 and 3, respectively. In FIG. 2, the fuse 1 is connected to power voltage in one terminal, and connected to a NMOS transistor N1 in the other terminal. The source of the NMOS transistor N1 is connected to the ground. The gate of the transistor N1 is connected to an anode of an inverter INV1. The node between the fuse 1 and the transistor N1 is connected to cathodes of the inverter INV1 and the inverter INV2, The anode of the inverter INV2 is connected to another inverter INV3, and the anode of the inverter INV3 is connected to a gate of the NMOS transistor N2. A drain of the transistor N2 is connected to power voltage and the source of the transistor N2 is connected to the node 1 in FIG. 1, as an output terminal. The circuit structure serves to output a fixed signal of logic "high" when the fuse 1 is cut out, and to output a fixed signal of logic "low" when the fuse 1 is not cut out.

FIG. 3 shows a circuit diagram of the second logic 13 of the state fixing part according to the present invention. The fuse 2 is connected to a power voltage in one terminal, and connected to a NMOS transistor N3 in the other terminal. The source of the NMOS transistor N3 is connected to the ground. The gate of the transistor N3 is connected to an anode of an inverter INV4. The node between the fuse 2 and the transistor N3 is connected to cathodes of the inverter INV4 and the inverter INV5, The anode of the inverter INV5 is connected to another inverter INV6, an anode of the inverter INV6 is connected to a cathode of other inverter INV7, and the anode of the inverter INV7 is connected to a gate of the NMOS transistor N4. The source of the transistor N4 is connected to a power voltage and a drain of the transistor N4 is connected to a node 1 shown in FIG. 1, as an output terminal. The circuit structure serves to output a fixed signal of logic "low" when the fuse 2 is cut out, and to output a fixed signal of logic "high" when the fuse 2 is not cut out. In such a way, the input signal of the residual address input receiver 30 is fixed as a state of "high" or "low", in response to the state of the fuse cut or not. As a result of the method as described above, ½ out of the entire memory cells is selected, thereby recovering the smaller density memory from the larger density memory. For example, a 16M memory can be converted to an 8M memory. These methods correspond to an ½ cells repairing technique by which a residual address signal is fixed with a conventional technique.

As shown in FIG. 1, the outputs of the address input receiver are connected to the address code selecting part 70, respectively and the address code selecting part 70 is connected to the inputs of the address input buffer, respectively. The address code selecting part 70 receives the signals of each of the address input receivers, and converts an input-to-output address signal path according to a control signal selecting the change of the address code to thereby output the changed address signal. The address output buffers receive the changed address signal output from the address code selecting part 70 to thereby output a new internal address. The detailed circuit of the address code selecting part 70 will be described below with the accompanying FIGS. 4 to 7.

Figure 4:
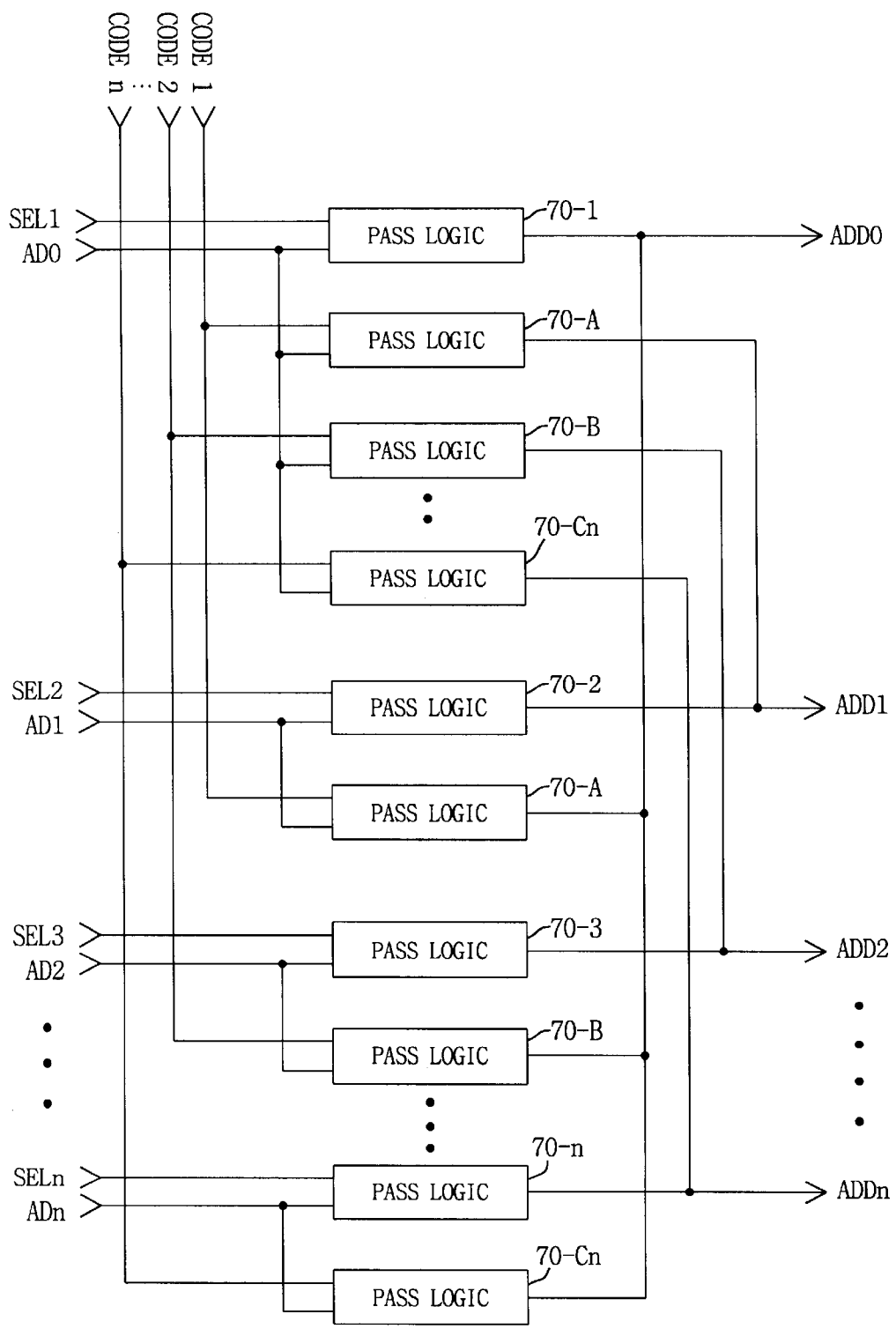
FIG. 4 is a block diagram showing input-to-output path of an address code selecting part 70 with a pre-coding type in accordance with an embodiment of the present invention.

FIG. 4 shows an input-to-output path in the address code selecting part 70 with an address free-coding type, by which an address scramble map is converted through the address free-coding method, thereby repairing a variety of failed memory cells. In detail, the internal circuit of the address code selecting part 70 is connected to a plurality of output paths to provide output signals of the state fixing part 10 and input address signals with selectable address signal paths. So, a plurality of pass logics are selectively connected to the output paths of each of the address signals and the output signals of the state fixing part 10 in response to an address selecting control signal and an address code control signal.

Figure 5:
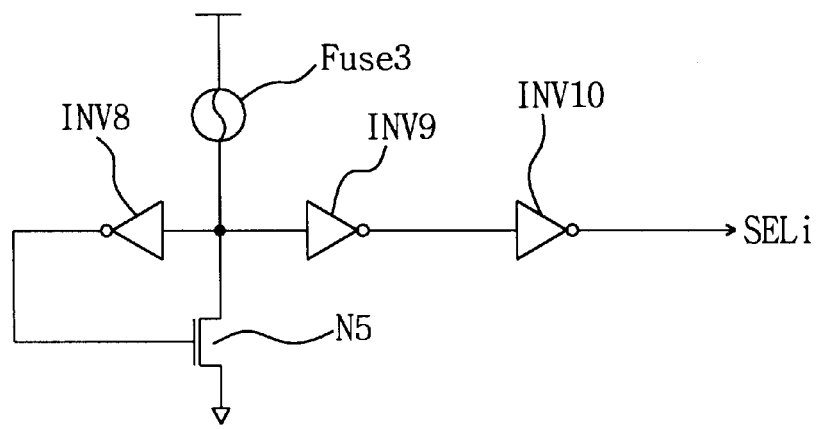
FIG. 5 is a circuit diagram of a second control part generating an address-selecting signal SELi in an embodiment of the present invention.

As shown in FIG. 4, the address selecting control signals SEL1, SEL2, SEL3, . . . , SELn are input to corresponding pass logics PASS LOGIC 70-1, PASS LOGIC 70-2, . . . , PASS LOGIC 70-n, thereby the control signals of a logic high state, or a logic low state are applied to each of the pass logics in the circuit structure as shown in FIG. 5. The signal ADO output from the state fixing part 10 is input to the pass logic 70-1 and the pass logics 70-A, . . . , 70-Cn related to the address code control signals CODE 1, CODE 2, . . . , CODE n. The output signals of each of the address input receivers AD1, AD2, . . . , And-1 are input to the pass logics to which the address selecting control signals are input and the pass logics to which the corresponding address code control signals are input. That is, the output signal ADO of the state fixing part 10 which fixes the residual address signal as a constant state is input to the pass logic 70-1 to which the address selecting control signal is also input, and also to the pass logics 70-A, . . . , 70-Cn so as to respectively respond to all the input of the address code control signals, thereby a pass logics are constructed so that the address signal AD0 may be controlled by the address selecting control signal SEL1 and the entire address code control signals CODE 1, . . . , CODE n. The other input address signals are controlled by the corresponding address selecting control signals and the code control signals in such a pass logics. Accordingly, in the relationship between the input to the pass logics and the output signal AD0 of the state fixing part 10 as shown in FIG. 4, the input to the pass logic 70-1 is the address selecting control signals SEL1 and AD0, the inputs to the pass logic 70-B are CODE2 and AD0, and the inputs to the pass logic 70-Cn are CODE n and AD0. In addition, in the relationship between the input to the pass logics and the address input signal AD1, the address selecting control signals SEL2 and AD1 are input to the pass logic 70-2, and the address code control signals CODE1 and AD1 are input to the pass logic 70-A. Further, in the relationship between the inputs to the pass logics and the address input signal AD2, the address selecting control signals SEL3 and AD2 are input to the pass logic 70-3, and the address code control signals CODE2 and AD2 are input to the pass logic 70-B.

In the relationship between the outputs of the pass logics, the pass logics 70-1, . . . , 70-n output the output signals ADD0, ADD1, . . . , ADDn, respectively. The pass logic 70-A out of the pass logics 70-A, . . . , 70-Cn to which the signal AD0 is input is connected to the output signal ADD 1 of the pass logic 70-2, the pass logic 70-B connected to the output signal ADD2 of the pass logic 70-3, and the pass logic 70-Cn is connected to the output signal ADDn of the pass logic 70-n. Meanwhile, all the pass logics 70-A, 70-B, 70-Cn to which the input address signals AD1, . . . , ADn-1 are connected to the output signal ADD0 of the pass logic 70-A to which the AD1 is input.

The address code selecting part 70 constructed in such a way is connected therein to a plurality of output paths to have a plurality of pass logics so that the selective address signal paths are provided by the address selection and code control of the address selecting control signal and the address code control signal in response to the output address signals AD0, AD1, . . . , And-1 of the address input receivers.

Figure 6:
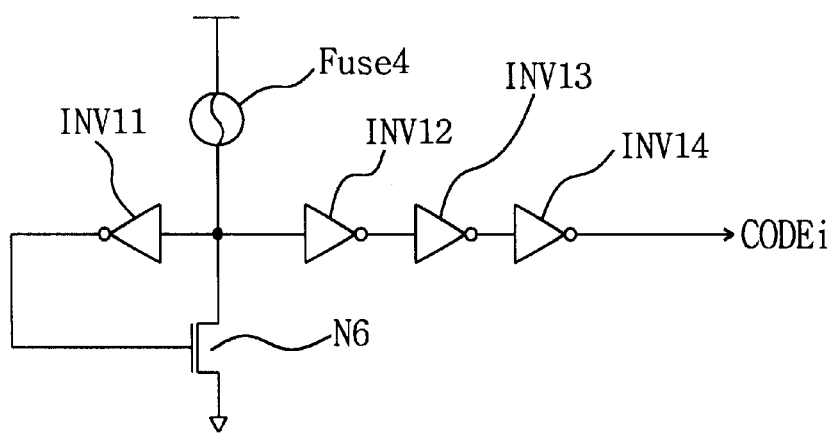
FIG. 6 is a circuit diagram of a second control part generating an address code control signal CODEi in accordance with an embodiment of the present invention.

The address selecting control signal SELi is output as a control signal by a circuit as shown in FIG. 5 and the address code control signal CODEi is output as a control signal by a circuit as shown in FIG. 6. These circuits will be explained below in more detail.

FIG. 5 is a circuit diagram of a first control part generating the address-selecting signal SELi according to an embodiment of the present invention. Referring to FIG. 5, the fuse 3 is connected to a power voltage in one terminal and to the drain of the NMOS transistor N5 in other terminal. The source of the NMOS transistor N5 is connected to the ground. The gate of the transistor N5 is connected to an anode of the inverter INV8. A node between the fuse 3 and the transistor N5 is connected to cathodes of the inverter INV8 and the inverter INV9, the anode of the inverter INV9 is connected to another inverter INV10, and the anode of the inverter INV10 outputs the address selecting control signal SELi. The circuit structure serves to output the address selecting control signal of logic "low" when the fuse 3 is cut, and to 10 output the address selecting control signal of logic "high" in case that the fuse 3 is not cut.

FIG. 6 is a circuit diagram of the second control part generating the address code control signal CODEi according to an embodiment of the present invention. In the circuit, the fuse 4 is connected to a power voltage in one terminal, and a drain of the NMOS transistor N6 in other terminal. In addition, the source of the NMOS transistor N6 is connected to the ground. The gate of the transistor N6 is connected to an anode of the inverter INV11. A node between the fuse 4 and the transistor N6 is connected to cathodes of the inverter INV11 and the inverter INV12, the anode of the inverter INV12 is connected to another inverter INV13, the anode of the inverter INV13 is connected to the cathode of the inverter INV14, and the anode of the inverter INV14 outputs the address code control signal CODEi. The circuit structure serves to output the address selecting control signal of logic "high" when the fuse 4 is cut, and to output the address selecting control signal of logic "low" in case that the fuse 4 is not cut.

Figure 7:
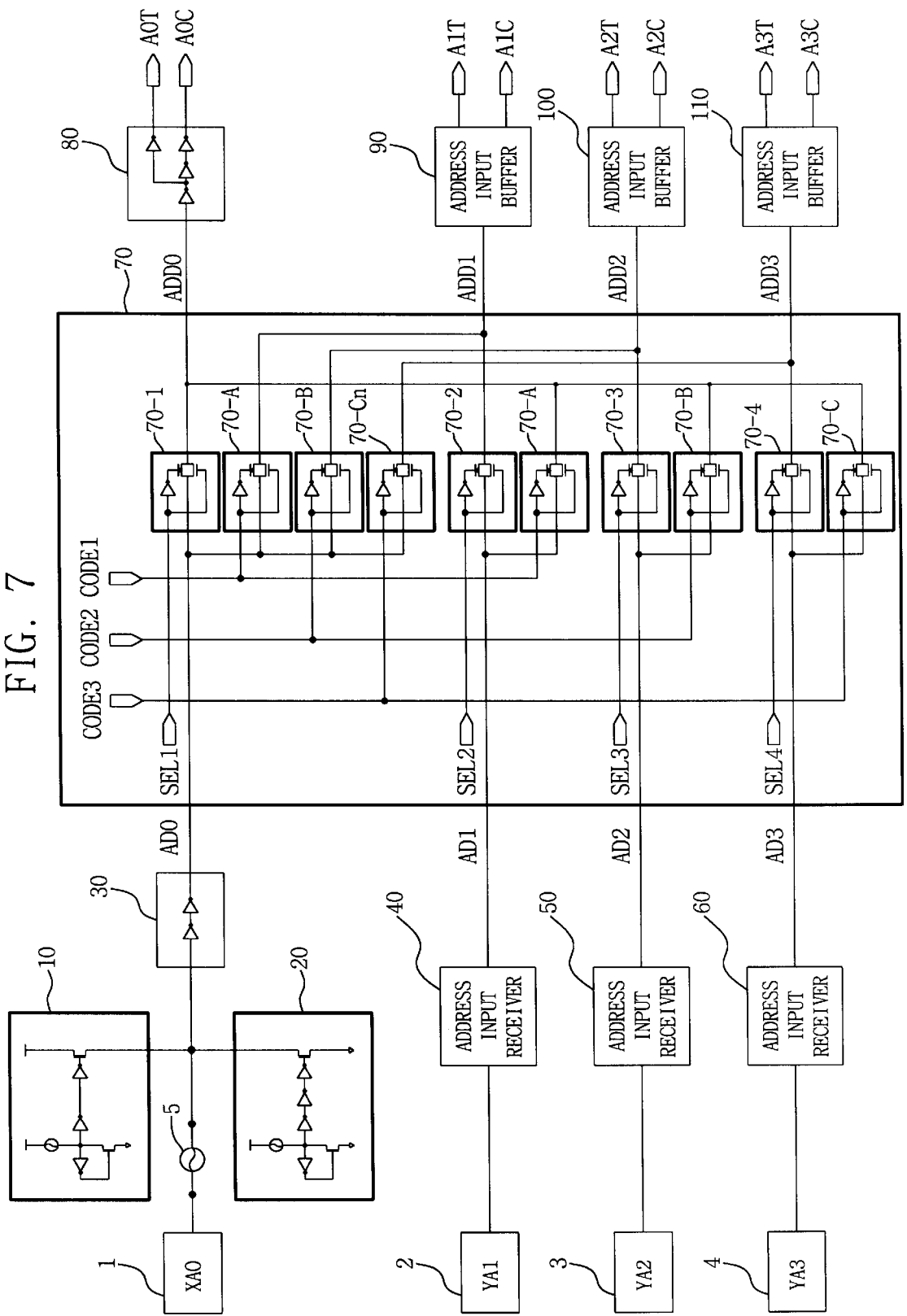
FIG. 7 is a detailed circuit diagram of a memory cell repairing apparatus in accordance with a preferred embodiment of the present invention.

The detailed embodiment as shown in FIGS. 1 to 6 is shown in FIG. 7. In other words, FIG. 7 shows a memory cell repairing apparatus by which recovering a 8M memory semiconductor from a 16M memory semiconductor. An embodiment of pass logic is realized with pass gates as shown in FIG. 7. Otherwise, it is also possible to realize the circuit with multiplexer MUX.

With such a memory cell repairing apparatus, the 16M memory semiconductor, for example, allows the address selecting control signal SEL1, . . . , n-1 to be selected and transferred to through the pass logics 70-1, . . . , 70-n, in contrast, the address code control signals CODE 1, . . . , n to be not selected to thereby break the signals which transferred through the pass logics 70-A, . . . , Cn. However, during conversion to a 8M memory semiconductor, the fuse 3 of the first control part which outputs the address selecting control signal SEL1 and the fuse 3 of the first control part which outputs one of the signals SEL2, . . . , n are cut and one of the address code control signals CODE 1, . . . , CODE n is allowed to be transferred to the output pass logic which is operated by cutting the fuse 4 of the second control part, thereby allowing the address scramble map to be converted.

The more detailed embodiment will be explained below with the circuit as shown in FIG. 7. The external address pad XAO in FIG. 7, for example, is a residual address when recovering a 8M memory from a 16M memory, which is a most significant bit MSB out of the addresses selecting a word line in a 16M memory semiconductor, and the YA1, YA2, YA3 are address selecting a memory cell block, in which the YA1 is a most significant bit MSB and the YA3 is a least significant bit LSB.

An operation for recovering an 8M-memory semiconductor from a 16M-memory semiconductor will be described below according to a various type of failed memory cells as shown in FIGS. 8 to 11.

Figure 8:
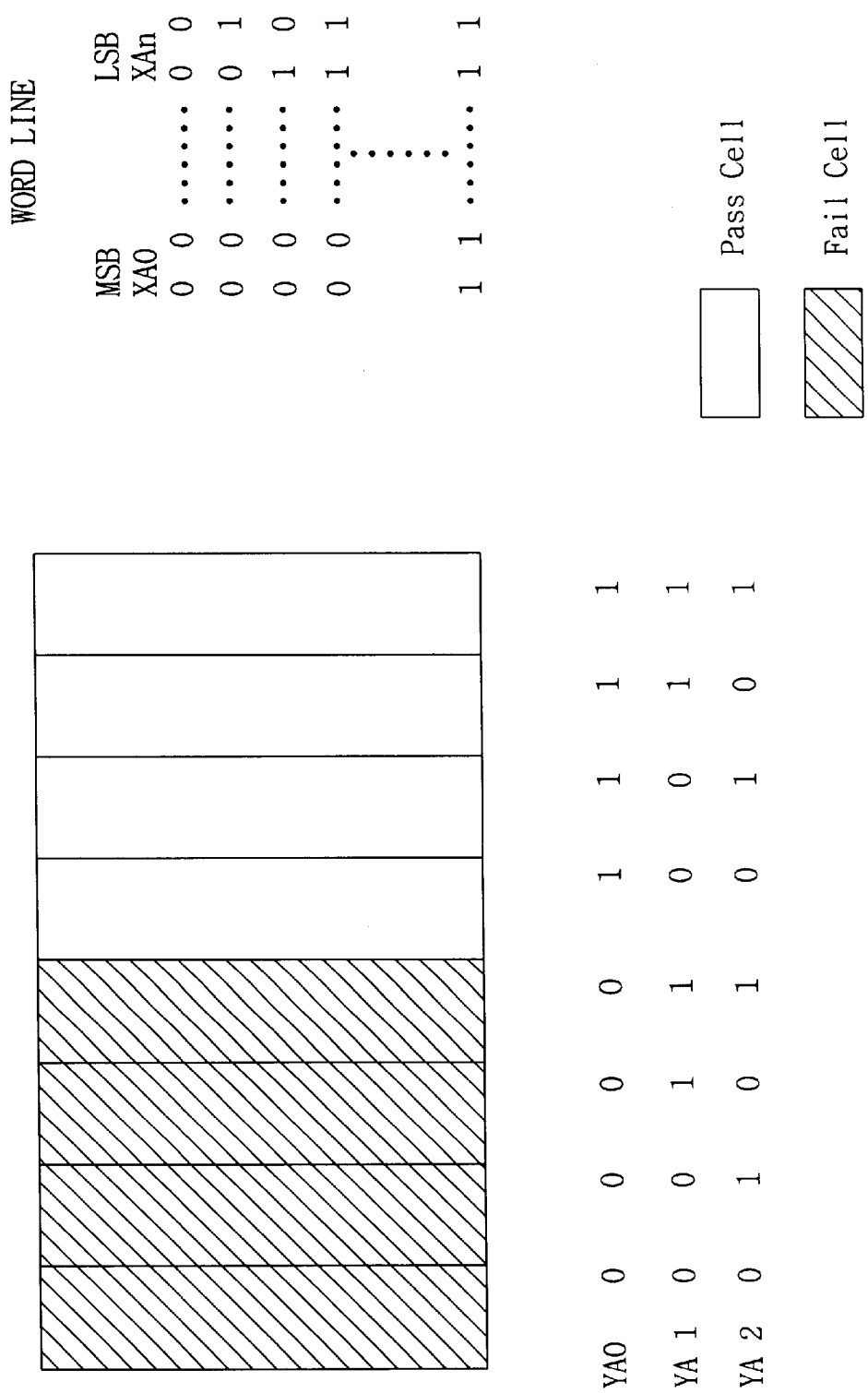
FIG. 8 is a first example of a failed memory cell which can be repaired in accordance with the present invention.

Referring to FIG. 8 in which a failed memory cell to be repaired is shown as an example 1. The failure type shown in FIG. 8 belongs to a column of the most significant bit type. In this case, the fuse 3 of the first control part as shown in FIG. 5 corresponding to the address selecting control signals SEL1 and SEL2 is allowed to be cut so that the signals being transferred through the pass logic 70-1 and the pass logic 70-2 of the address code selecting part 70 as shown in FIG. 7 may be broken, thereby the signals SEL1 and SEL2 are output as a logic "low" and the pass logic 70-1 and 70-2 are turned-off. And at the same time, the fuse 4 of the second control part corresponding to the address code control signal CODE1 as shown in FIG. 6 is cut so that the signal CODE1 is output as a logic "high" and the pass logic 70-A is turned on. Meanwhile, when the fuse of the first logic 11 of the state fixing part 10 is cut, thereby the AD0 is fixed as a logic "high", the output ADD1 of the address code selecting part maintains a logic "high" as fixed and the output ADD0 is shifted by the external address pad signal YA1. Accordingly, such a failure type as shown in FIG. 8 can be repaired from a 16M-memory cell to an 8M-memory cell.

Figure 9:
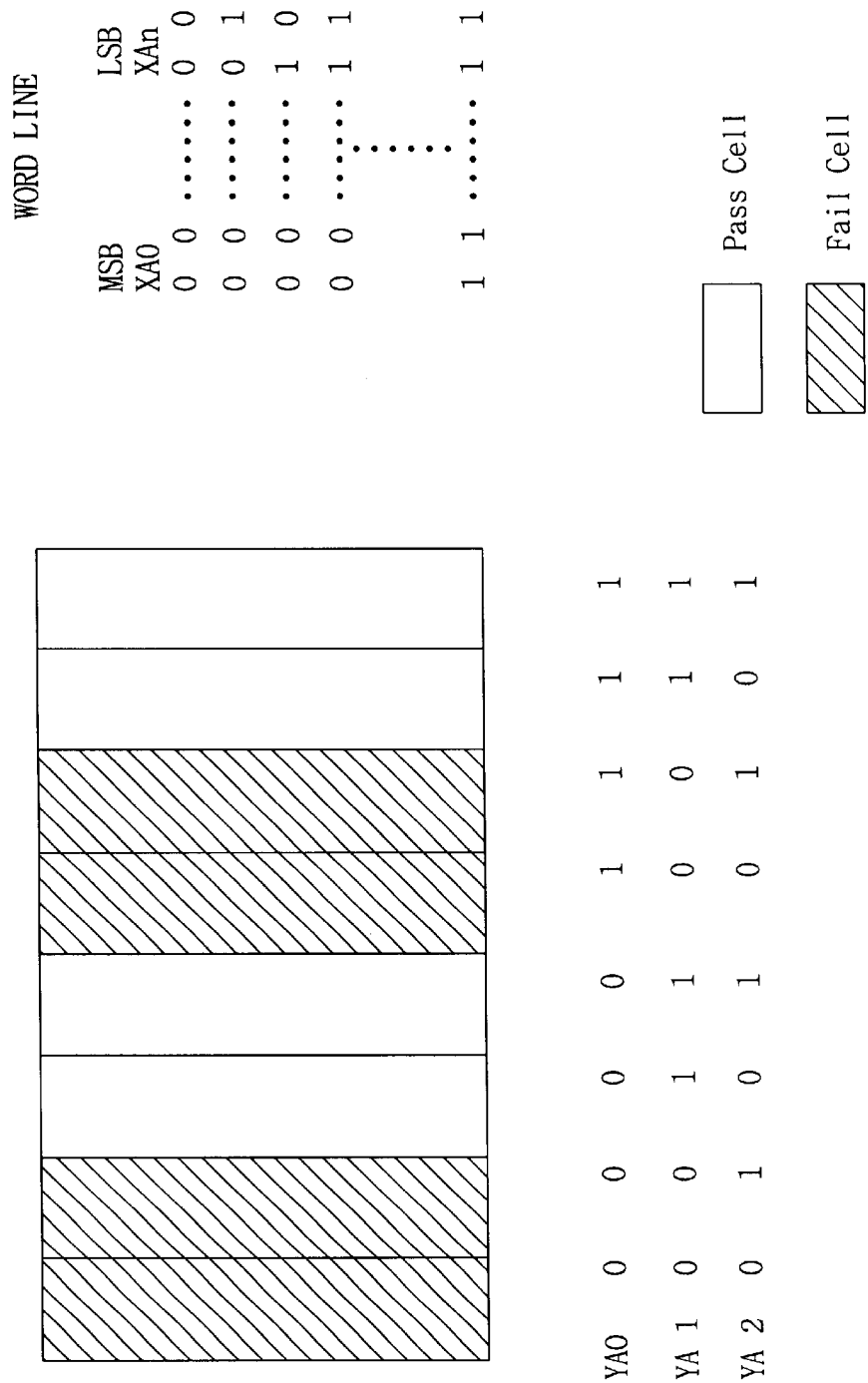
FIG. 9 is a second example of a failed memory cell which can be repaired in accordance with the present invention.

Referring to FIG. 9 in which a failed memory cell type to be repaired is shown as an example 2. This type shows a least significant bit type of failure. In this case, the address selecting control signals SEL1 and SEL3 are output as logic "low" and the pass logic 70-1 and the pass logic 70-3 of the address code selecting part 70 are turned off, and at the same time, the address code control signal CODE2 is output as a logic "high" and the pass logic 70-B is turned on, thereby the input signal AD0 is changed in its output path and accordingly is output to the ADD2 through a new output path. Meanwhile, the fuse of the first logic 11 of the state fixing part 10 is cut, thereby the AD0 is fixed as a logic "high", then the output ADD2 of the address code selecting part maintains a logic "high" as fixed. The output ADD0 is shifted by the external address pad signal YA2. Accordingly, such a failure type as shown in FIG. 9 can be repaired by conversion of an address scramble map from a 16M-memory cell to an 8M-memory cell.

Figure 10:
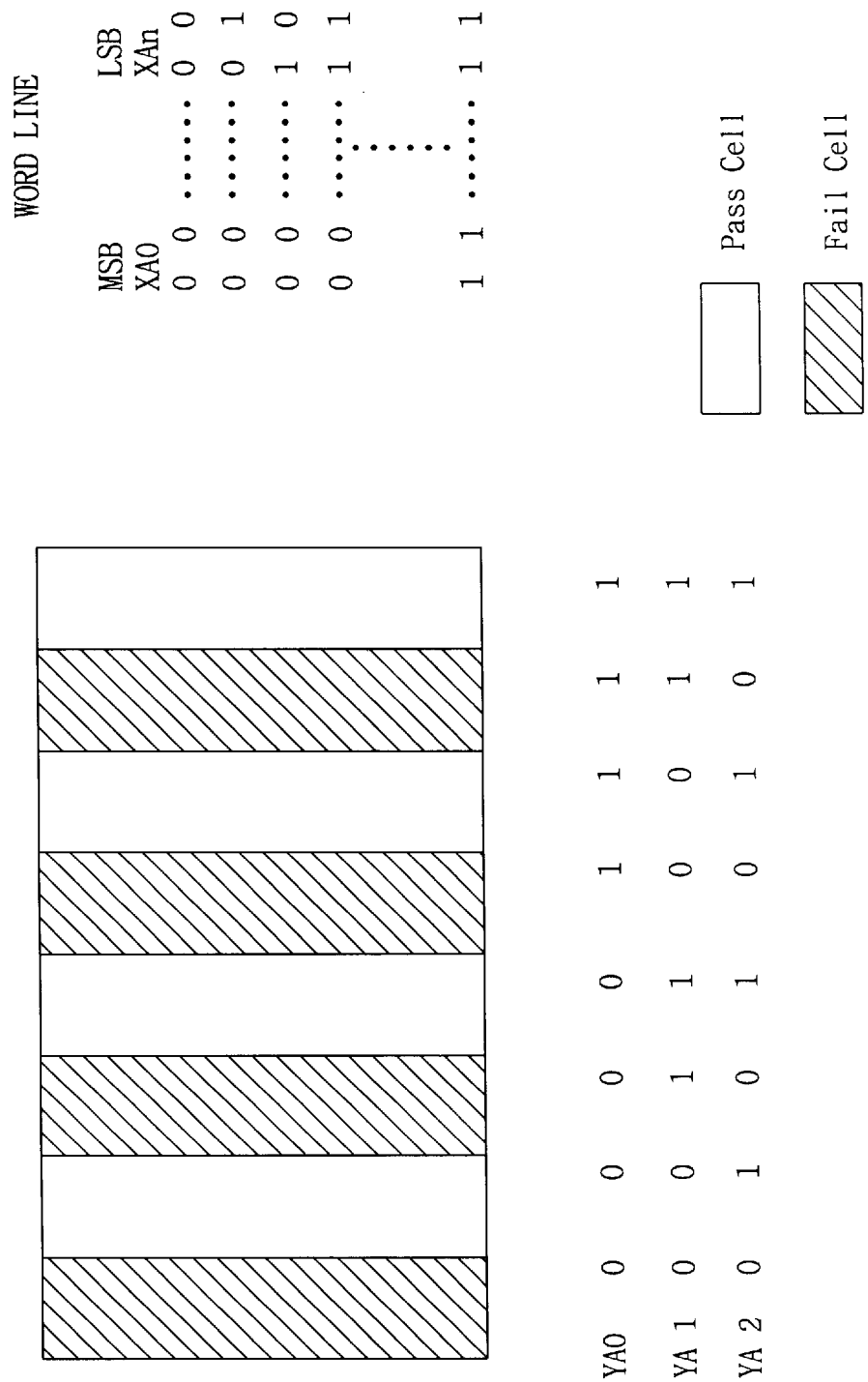
FIG. 10 shows a failed memory cell type to be repaired as an example.

And, referring to FIG. 10 in which a failed memory cell type to be repaired is shown as an example 3. This type shows a row least significant bit type of failure. In this case, the address selecting control signals SEL1 and SEL4 are output as logic "low" and the pass logic 70-1 and the pass logic 70-4 of the address code selecting part 70 are turned off, and at the same time, the address code control signal CODE3 is output as a logic "high" and the pass logic 70-C is turned on, thereby the input signal AD0 is changed in its output path and accordingly is output to the ADD3 through a new output path. Meanwhile, the fuse of the first logic 11 of the state fixing part 10 is cut, thereby the AD0 is fixed as a logic "high", then the output ADD3 of the address code selecting part maintains a logic "high" as fixed. The output ADD0 is shifted by the external address pad signal YA3. Accordingly, such a failure type as shown in FIG. 10 can also be repaired by conversion of an address scramble map from a 16M-memory cell to an 8M-memory cell.

Figure 11:
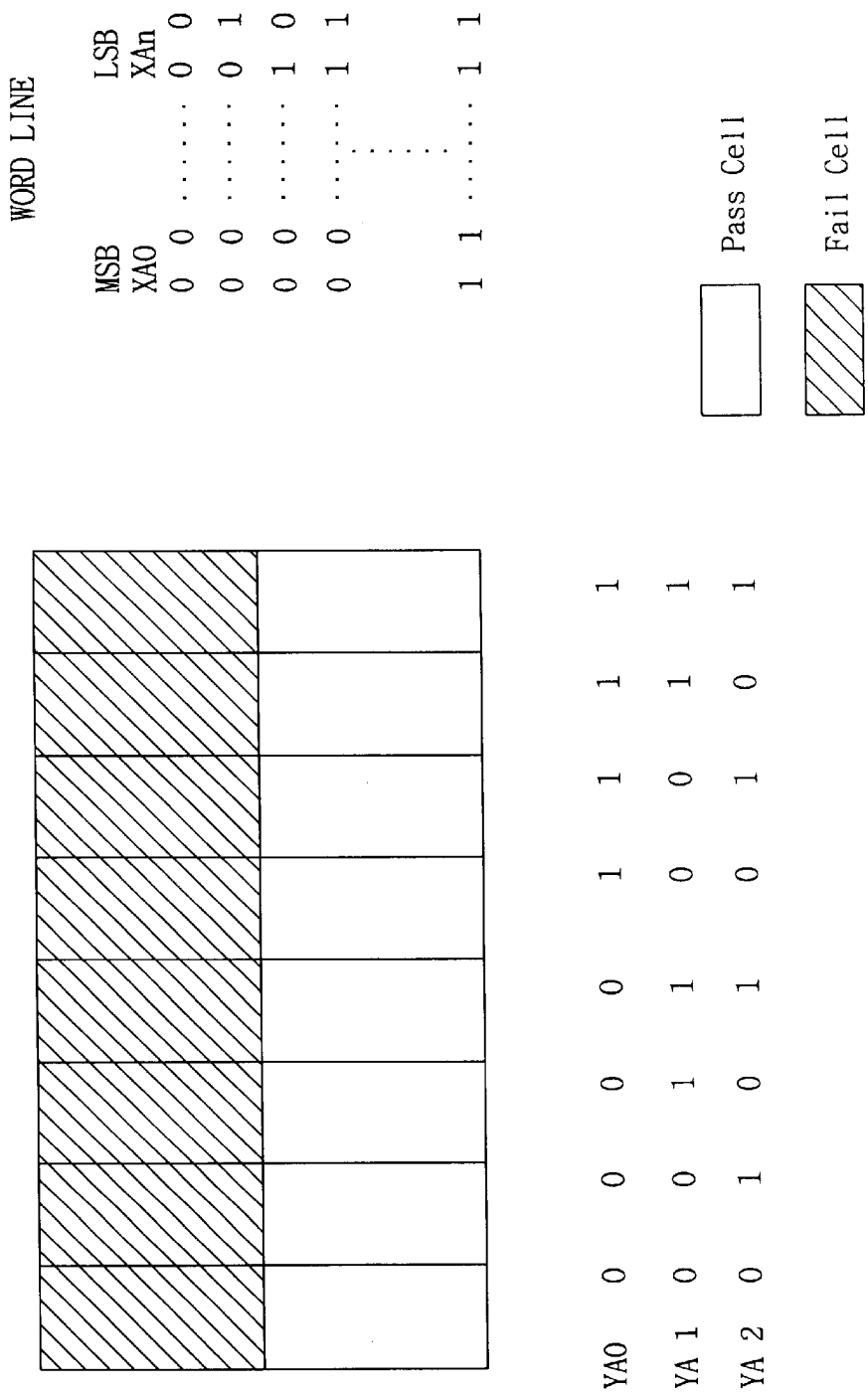
FIG. 11 shows a row highest-level bit type of failure to be repaired as an example 4.

Referring to FIG. 11 in which a row most significant bit type of failure to be repaired is shown as an example 4. In this case, the address selecting control signal SEL1 is output as a logic "high" selected and the pass logic 70-1 is turned on. And the input signal AD0 is output as a signal ADD0, thereby the fixed signal of logic "high" or logic "low" is output. So such a failure type as shown in FIG. 11 can also be repaired by conversion of an address scramble map from a 16M-memory cell to an 8M-memory cell.

The above-referenced description was limited to the apparatus for recovering the 8M memory cell from the 16M memory cell by converting the address scramble map of the failed memory cell using the external address pad XAO which is the most significant bit out of the address selecting a word line. However, the address free-code as described in the above can be performed by using the least significant bit XAn.

Therefore, although a various type of failure is generated in memory cells, any normal cells other than failed memory cells can correspondingly be recovered.

Figure 12:
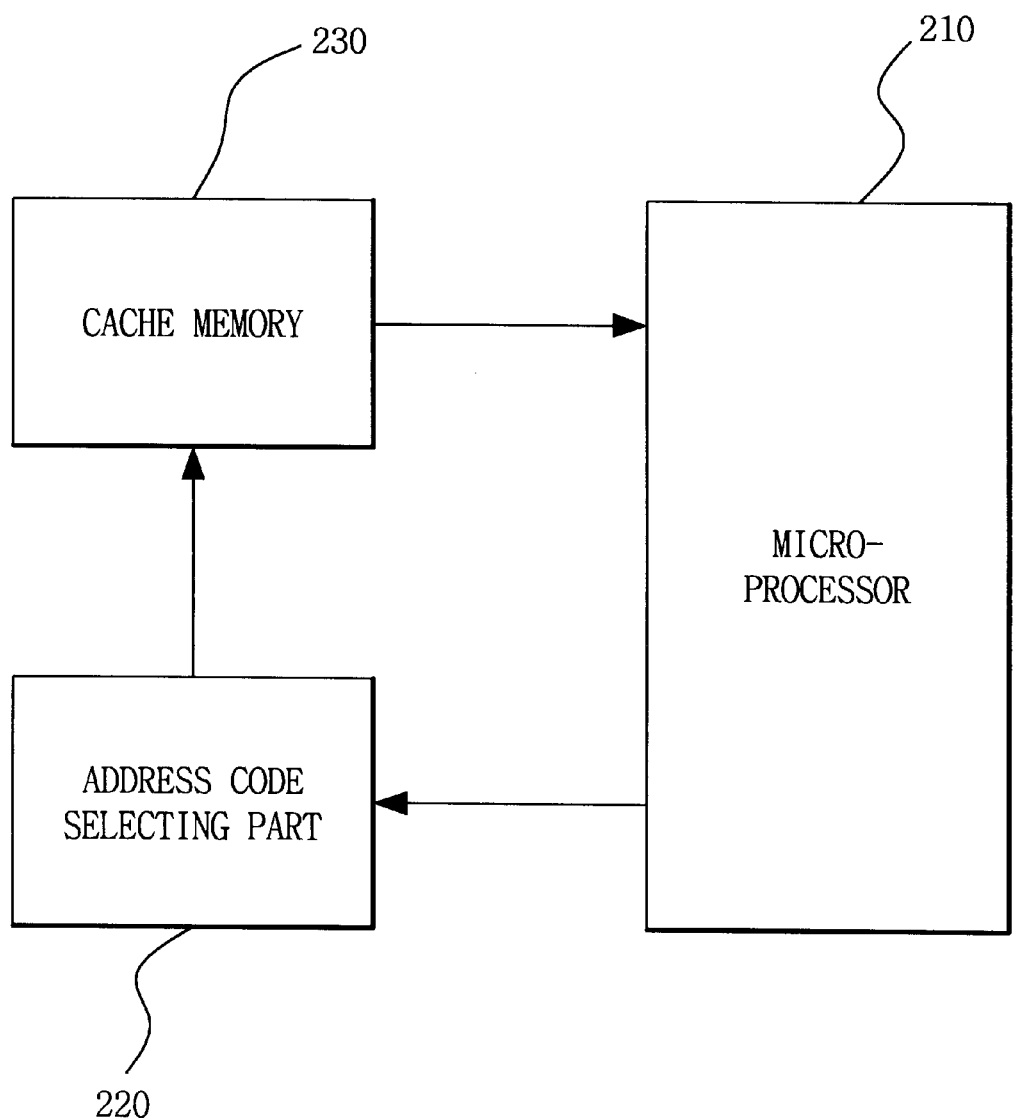
FIG. 12 is a block diagram of memory cell repairing apparatus being applied to an on-chip cache memory according to another embodiment of the present invention.

Another embodiment of the present invention will explain a memory cell repairing apparatus which applied to an on-chip cache memory as shown in FIG. 12. FIG. 12 is a block diagram of memory cell repairing apparatus being applied to an on-chip cache memory, which comprises a micro-processor 210, an address code selecting part 220, and a cache memory 230. This embodiment explains an on-chip cache memory for using it as a smaller density memory by repairing it when the cache memory is failed.

The micro-processor 210 serves to detect if any failure exists in memory cells in response to the input of a bit map address signal from the cache memory 230 and to generate a control signal for converting an address scramble map and a residual address fixing control signal for smaller density when a rule in the failure is detected in the memory cell. The control signals correspond to the address selecting control signal and the address code control signal as described in an embodiment of the present invention.

The address code selecting part 220 outputs the residual address fixing control signal for smaller density which is outputted from the micro-processor 210 and the changed address buffer signal which is changed in the input-to-output address signal path in order to convert the address scramble map in response to the control signal, as shown in FIG. 4, or FIG. 7.

The cache memory 230 is used as a smaller density cell if a changed address buffer signal is output resulting from the address scramble conversion in the address code selecting part 220 for smaller density.

Where, the method of converting the address scramble map and the structure of the address code selecting part 22 are in accordance with the circuit structure in FIGS. 4 and 7 and explanation thereto.

That is, the memory cell repairing apparatus shown in the embodiments of the present invention is directed to a memory cell repairing technique that can be applied not only to the step of manufacturing a memory semiconductor but also to the operation of the micro processor using an on-chip cache memory.

Accordingly, the method of repairing the memory cells according to the present invention comprises the steps of: detecting a failure rule in memory cells by testing a bit map of failed memory cells, fixing a residual address signal for conversion to a smaller density memory as a constant state when a failure rule is detected in the failed memory cell, selectively converting an input-to-output address signal path in response to a predetermined signal to output the changed address code by changing an address scramble map, and outputting the changed address code to recover a smaller density memory cell from a larger density memory cell.

The step of converting the address scramble map includes the steps of cutting the original output pass path of an address to be converted in response to the address selecting control signal, forming an output path of the address to be converted in accordance with a new output pass path selected by the address code control signal, and outputting an address code signal converted through the newly-formed address output pass path.

While the invention has been described with reference to the accompanying drawings in terms of the preferred embodiments, those skilled in the art will recognize that the invention can be practiced with various changes and modifications within the spirit and scope of the appended claims. Therefore, the protective scope of the present invention is not limited to the disclosure as described in the preferred embodiments.

What is claimed is:

1. A memory cell repairing apparatus comprising:
    a state fixing part operable to fix a specific external input address signal out of external input addresses as a constant state;
    address input receivers operable to receive output signals of the state fixing part and external input signals;
    an address code selecting part to receive output address signals of the address input receiver and to convert output address signal paths through a control signal which selects address code change to output the changed address signal; and
    address input buffers operable to receive the changed address signal outputted from the address code selecting part to output a new internal address.

2. The apparatus as defined in claim 1, wherein the state fixing part further comprises a first logic operable to fix and output a first state signal when a fuse is cut and a second state signal when a second fuse is not cut; and a second logic to fix and output a second state signal when a second fuse is cut and a first state signal when a second fuse is not cut.

3. The apparatus as defined in claim 2, wherein the first state signal is a signal of logic high and the second state signal is a signal of logic low.

4. The apparatus as defined in claim 1, wherein the address code selecting part is connected with a plurality of output paths to provide selective address signal paths for input of each address signals and output signals of the state fixing part which are output address signals of the address input receivers and includes a plurality of pass logics being selectively connected to output paths of each address signals and output signals of the state fixing part in response to a control signal.

5. The apparatus defined in claim 1, wherein the control signal includes an address selecting control signal being outputted as a logic high or a logic low and an address code control signal being outputted a logic signal opposite to the address selecting control signal.

6. The apparatus as defined in claim 5, wherein the address selecting control signal is generated in a first control part which serves to output a third state of address selecting control signal when a third fuse is cut, and output a fourth state of address selecting control signal when the third fuse is not cut out; and the address code control signal is generated in a second control part which serves to output a fourth state of address code control signal when a fourth fuse is cut out, and output a third state of address code control signal when the fourth fuse is not cut-out.

7. The apparatus as defined in claim 6, wherein the third state is a logic low, and the fourth state is a logic high.

8. The apparatus as defined in claim 1, wherein the address code selecting part further comprises:
    first pass logics being turned-on and transferring to the outside address signals or output signals of the state fixing part corresponding to the address selecting control signal when the third state of address selecting control signal is applied, and being turned-off and cutting off from transferring to the outside address signals or output signals of the state fixing part corresponding to the address selecting control signal when the fourth state of address selecting control signal is applied; and
    second pass logics being turned off and cutting-off the address signals and the output signals of the state fixing part from transferring to the outside when the third state of address code control signal is not selected, and being turned-on and converting output address signal paths of the address signals and the output signals of the state fixing part to output the converted address signals through the converted paths when the address code control signal is selected.

9. The apparatus as defined in claim 1, wherein the specific external input address signal as a residual signal is a most significant bit signal out of addresses which select word lines.

* * * * *

UNITED STATES PATENT AND TRADEMARK OFFICE
CERTIFICATE OF CORRECTION

PATENT NO.   : 6,693,831 B2
DATED        : February 17, 2004
INVENTOR(S)  : Park It is certified that error appears in the above-identified patent and that said Letters Patent is hereby corrected as shown below:

Column 4,
Line 55, "an 1/2 cells repairing" should read -- an 1/2-cells repairing --.

Column 5,
Line 23, "signal ADO output" should read -- signal AD0 output --.
Line 30, "signal ADO of" should read -- signal AD0 of --.

Column 6,
Line 29, "and to 10 output" should read -- and to output --.

Column 8,
Line 20, "pad XAO which" should read -- pad XA0 which --.

Signed and Sealed this

Tenth Day of August, 2004

JON W. DUDAS
*Acting Director of the United States Patent and Trademark Office*